US010809783B2

(12) United States Patent
Sato (10) Patent No.: US 10,809,783 B2
(45) Date of Patent: Oct. 20, 2020

(54) POWER SOURCE SYSTEM

(71) Applicant: JTEKT CORPORATION, Osaka-shi, Osaka (JP)

(72) Inventor: Fumihiko Sato, Kashiwara (JP)

(73) Assignee: JTEKT CORPORATION, Osaka-shi (JP)

( * ) Notice: Subject to any disclaimer, the term of this patent is extended or adjusted under 35 U.S.C. 154(b) by 208 days.

(21) Appl. No.: 16/055,453

(22) Filed: Aug. 6, 2018

(65) Prior Publication Data

US 2019/0056771 A1 Feb. 21, 2019

(30) Foreign Application Priority Data

Aug. 16, 2017 (JP) ................. 2017-157217

(51) Int. Cl.
*G06F 1/26* (2006.01)
*B60L 50/40* (2019.01)
(Continued)

(52) U.S. Cl.
CPC ............. *G06F 1/263* (2013.01); *B60L 50/40* (2019.02); *B62D 5/046* (2013.01); *B62D 5/0463* (2013.01); *B62D 5/0481* (2013.01); *H02J 7/0029* (2013.01); *H02J 7/0068* (2013.01); *H02J 7/1415* (2013.01); *H02J 7/1423* (2013.01); *H02J 7/342* (2020.01); *H02P 23/14* (2013.01);
(Continued)

(58) Field of Classification Search
CPC ........ H03K 3/017; H03K 7/08; B62D 5/0463; B62D 5/0481; H02J 7/0068; H02J 7/0029; H02J 2207/20; H02P 23/14; G06F 1/263; B60L 50/40; G01L 5/221
See application file for complete search history.

(56) References Cited

U.S. PATENT DOCUMENTS

2011/0098887 A1 4/2011 Fujimoto
2014/0222294 A1* 8/2014 Sugiyama ............ B62D 5/0481
701/42
(Continued)

FOREIGN PATENT DOCUMENTS

EP 2 727 796 A2 5/2014
JP 2014-150672 A 8/2014

OTHER PUBLICATIONS

Jan. 7, 2019 Extended Search Report issued in European Patent Application No. 18188216.8.

*Primary Examiner* — Jared Fureman
*Assistant Examiner* — Duc M Pham
(74) *Attorney, Agent, or Firm* — Oliff PLC (57) ABSTRACT

A power source device includes a switching circuit configured to switch the power supply mode between a first power supply mode, in which power is supplied to a drive circuit for an electric motor by only a main power source, and a second power supply mode, in which power is supplied to the drive circuit utilizing both the main power source and an auxiliary power source. A control device includes: a determination unit that determines whether the operation state of the electric motor is a regeneration state or a power-running state; and a unit configured to limit power to be supplied to the drive circuit when the power supply mode is the second power supply mode and it is determined by the determination unit that the operation state of the electric motor is the regeneration state.

10 Claims, 5 Drawing Sheets

(51) Int. Cl.
*H02J 7/14* (2006.01)
*H02J 7/00* (2006.01)
*B62D 5/04* (2006.01)
*H02J 7/34* (2006.01)
*H02P 23/14* (2006.01)
*H03K 3/017* (2006.01)
*G01L 5/22* (2006.01)
*H03K 7/08* (2006.01)

(52) U.S. Cl.
CPC .............. *H03K 3/017* (2013.01); *G01L 5/221* (2013.01); *H02J 7/00302* (2020.01); *H03K 7/08* (2013.01)

(56) References Cited

U.S. PATENT DOCUMENTS

2015/0314754 A1* 11/2015 Eto .................... B60L 50/50
340/436
2017/0210413 A1* 7/2017 Tsujioka ............. B62D 5/046

* cited by examiner

POWER SOURCE SYSTEM

INCORPORATION BY REFERENCE

The disclosure of Japanese Patent Application No. 2017-157217 filed on Aug. 16, 2017 including the specification, drawings and abstract, is incorporated herein by reference in its entirety.

BACKGROUND OF THE INVENTION

1. Field of the Invention

The present invention relates to a power source system for use in a vehicle that includes an electric motor.

2. Description of the Related Art

Japanese Patent Application Publication No. 2014-150672 (JP 2014-150672 A) discloses a power source device (power supply device) configured to supply power to a drive circuit for an electric motor for an electric power steering (EPS) system. The power source device described in JP 2014-150672 A includes a main power source, a single auxiliary power source, a charge circuit, and a switching circuit (discharge circuit). The single auxiliary power source is connected to the main power source. The charge circuit charges the auxiliary power source on the basis of the main power source. The switching circuit performs switching between a normal output voltage mode, in which power is supplied to the drive circuit by only the main power source, and a high-output voltage mode, in which power is supplied to the drive circuit utilizing both the main power source and the auxiliary power source through discharge of the auxiliary power source.

When a high load is imposed on the electric power steering system, the switching circuit sets a power supply mode to the high-output voltage mode. In this case, the auxiliary power source is in a discharge state. When a low load is imposed on the electric power steering system, on the other hand, the switching circuit sets the power supply mode to the normal output voltage mode, and charges the auxiliary power source.

Factors that may hinder normal operation of the electric power steering system include generation of a counter-electromotive force due to reverse input to the electric motor. A counter-electromotive force is generated when the operation state of the electric motor is brought into a regeneration state with the electric motor rotated by an external force due to travel on a rocky road or the vehicle riding onto a curb, for example. If a counter-electromotive force due to reverse input is generated when the power supply mode is the high-output voltage mode, the counter-electromotive force is added to the output voltage of the power source device, and a failure may be caused in the electric power steering system because of an overvoltage.

SUMMARY OF THE INVENTION

An object of the present invention is to provide a power source system that can suppress an excessive output voltage from a power source device when the operation state of an electric motor is brought into a regeneration state.

An aspect of the present invention provides a power source system for use in a vehicle that includes an electric motor, the power source system including: a power source device; and a control device that controls the power source device, in which: the power source device includes a main power source, an auxiliary power source, and a switching circuit configured to switch a power supply mode between a first power supply mode, in which power is supplied to a drive circuit for the electric motor by only the main power source, and a second power supply mode, in which power is supplied to the drive circuit utilizing both the main power source and the auxiliary power source; and the control device includes a switching circuit control unit that controls the switching circuit on the basis of a value that matches power consumption by the drive circuit, a determination unit that determines whether an operation state of the electric motor is a regeneration state or a power-running state, and a limitation unit that limits power to be supplied to the drive circuit when the power supply mode is the second power supply mode and it is determined by the determination unit that the operation state of the electric motor is the regeneration state.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Figure 1:
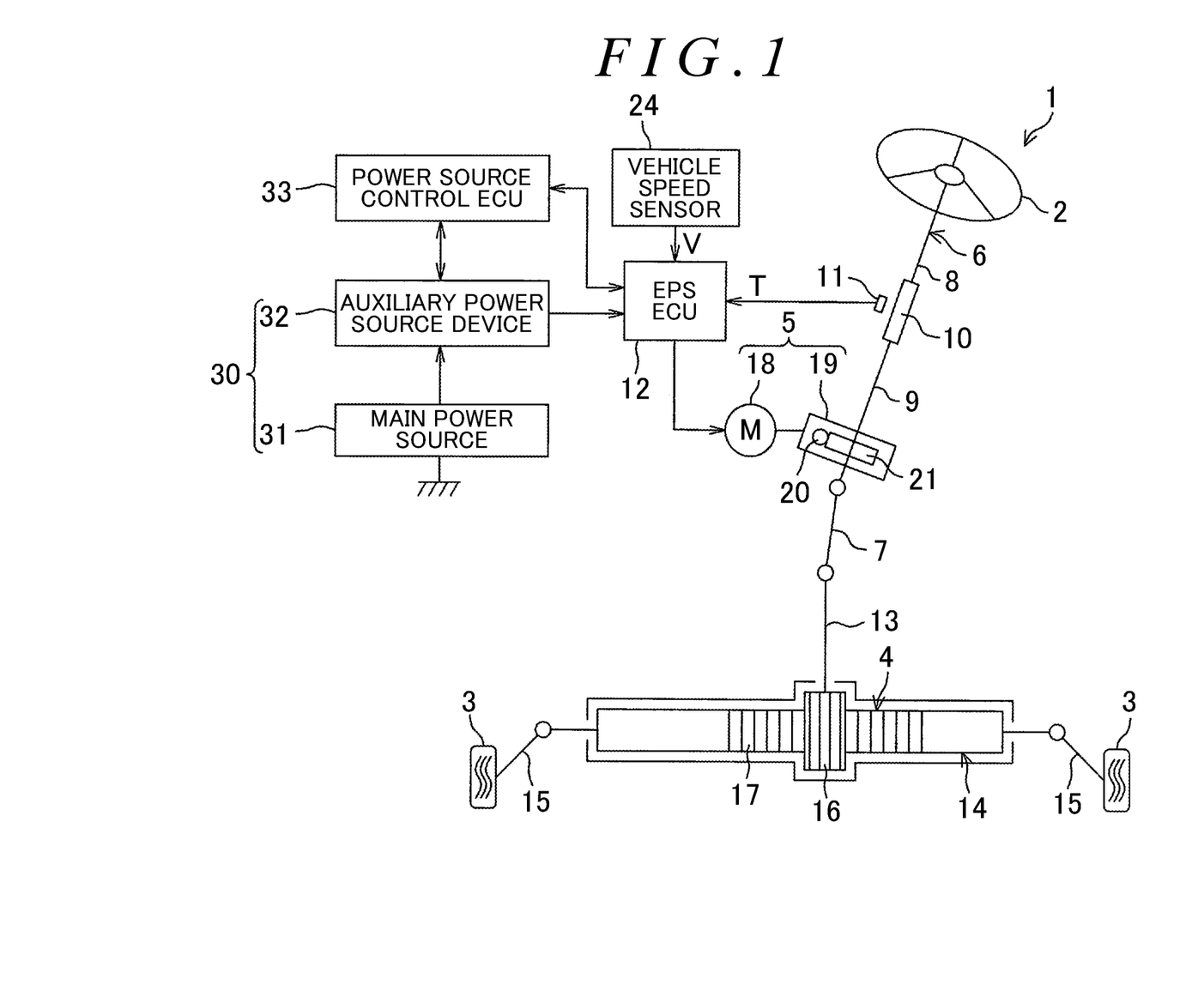
FIG. 1 is a schematic diagram illustrating a schematic configuration of an electric power steering system to which a power source system according to an embodiment of the present invention is applied.

An embodiment of the present invention will be described in detail below with reference to the accompanying drawings. FIG. 1 is a schematic diagram illustrating a schematic configuration of an electric power steering system to which a power source system according to an embodiment of the present invention is applied. An electric power steering (EPS) system 1 includes a steering wheel 2, a steering operation mechanism 4, and a steering assist mechanism 5. The steering wheel 2 is a steering member configured to steer the vehicle. The steering operation mechanism 4 steers steered wheels 3 in conjunction with rotation of the steering wheel 2. The steering assist mechanism 5 assists a driver in steering. The steering wheel 2 and the steering operation mechanism 4 are mechanically coupled to each other via a steering shaft 6 and an intermediate shaft 7.

The steering shaft 6 includes an input shaft 8 and an output shaft 9. The input shaft 8 is coupled to the steering wheel 2. The output shaft 9 is coupled to the intermediate shaft 7. The input shaft 8 and the output shaft 9 are coupled so as to be rotatable relative to each other via a torsion bar 10. A torque sensor 11 is disposed in the vicinity of the torsion bar 10. The torque sensor 11 detects steering torque T applied to the steering wheel 2 on the basis of the amount of relative rotational displacement between the input shaft 8 and the output shaft 9. In the embodiment, the steering torque T which is detected by the torque sensor 11 is detected as a positive value when the vehicle is steered to the right, and as a negative value when the vehicle is steered to the left, and the magnitude of the steering torque T is larger as the absolute value of the positive or negative value is larger.

The steering operation mechanism 4 is composed of a rack-and-pinion mechanism that includes a pinion shaft 13 and a rack shaft 14 that serves as a steered shaft. The steered wheels 3 are coupled to end portions of the rack shaft 14 via tie rods 15 and knuckle arms (not illustrated). The pinion shaft 13 is coupled to the intermediate shaft 7. A pinion 16 is coupled to the distal end of the pinion shaft 13. The rack shaft 14 extends linearly along the right-left direction of the automobile. A rack 17 meshed with the pinion 16 is formed at an intermediate portion of the rack shaft 14 in the axial direction. The pinion 16 and the rack 17 convert rotation of the pinion shaft 13 into movement of the rack shaft 14 in the axial direction. The steered wheels 3 can be steered by moving the rack shaft 14 in the axial direction.

When the steering wheel 2 is operated (rotated), rotation of the steering wheel 2 is transferred to the pinion shaft 13 via the steering shaft 6 and the intermediate shaft 7. The pinion 16 and the rack 17 convert rotation of the pinion shaft 13 into movement of the rack shaft 14 in the axial direction. Consequently, the steered wheels 3 are steered. The steering assist mechanism 5 includes an electric motor 18 for steering assist, and a speed reducer 19 configured to transfer output torque from the electric motor 18 to the steering operation mechanism 4. The speed reducer 19 is composed of a worm gear mechanism that includes a worm gear 20 and a worm wheel 21 meshed with the worm gear 20.

The worm gear 20 is rotationally driven by the electric motor 18. The worm wheel 21 is coupled so as to be rotatable together with the steering shaft 6. The worm wheel 21 is rotationally driven by the worm gear 20. When the worm gear 20 is rotationally driven by the electric motor 18, the worm wheel 21 is rotationally driven to rotate the steering shaft 6. Rotation of the steering shaft 6 is transferred to the pinion shaft 13 via the intermediate shaft 7. The pinion 16 and the rack 17 convert rotation of the pinion shaft 13 into movement of the rack shaft 14 in the axial direction. Consequently, the steered wheels 3 are steered. That is, the worm gear 20 is rotationally driven by the electric motor 18 to enable steering assist by the electric motor 18.

The vehicle is provided with a vehicle speed sensor 24 configured to detect a vehicle speed V. The steering torque T which is detected by the torque sensor 11, the vehicle speed V which is detected by the vehicle speed sensor 24, and so forth are input to an EPS electronic control unit (ECU) 12. The EPS ECU 12 performs so-called assist control by controlling the electric motor 18 on the basis of such inputs.

Power is supplied to a motor drive circuit 42 and a power source IC 43 (see FIG. 2) in the EPS ECU 12 by one or both of a main power source 31 and a capacitor (auxiliary power source) 54 (see FIG. 2) in an auxiliary power source device 32. The auxiliary power source device 32 is controlled by a power source control ECU 33. The EPS ECU 12 and the power source control ECU 33 are connected to each other via a communication line.

Figure 2:
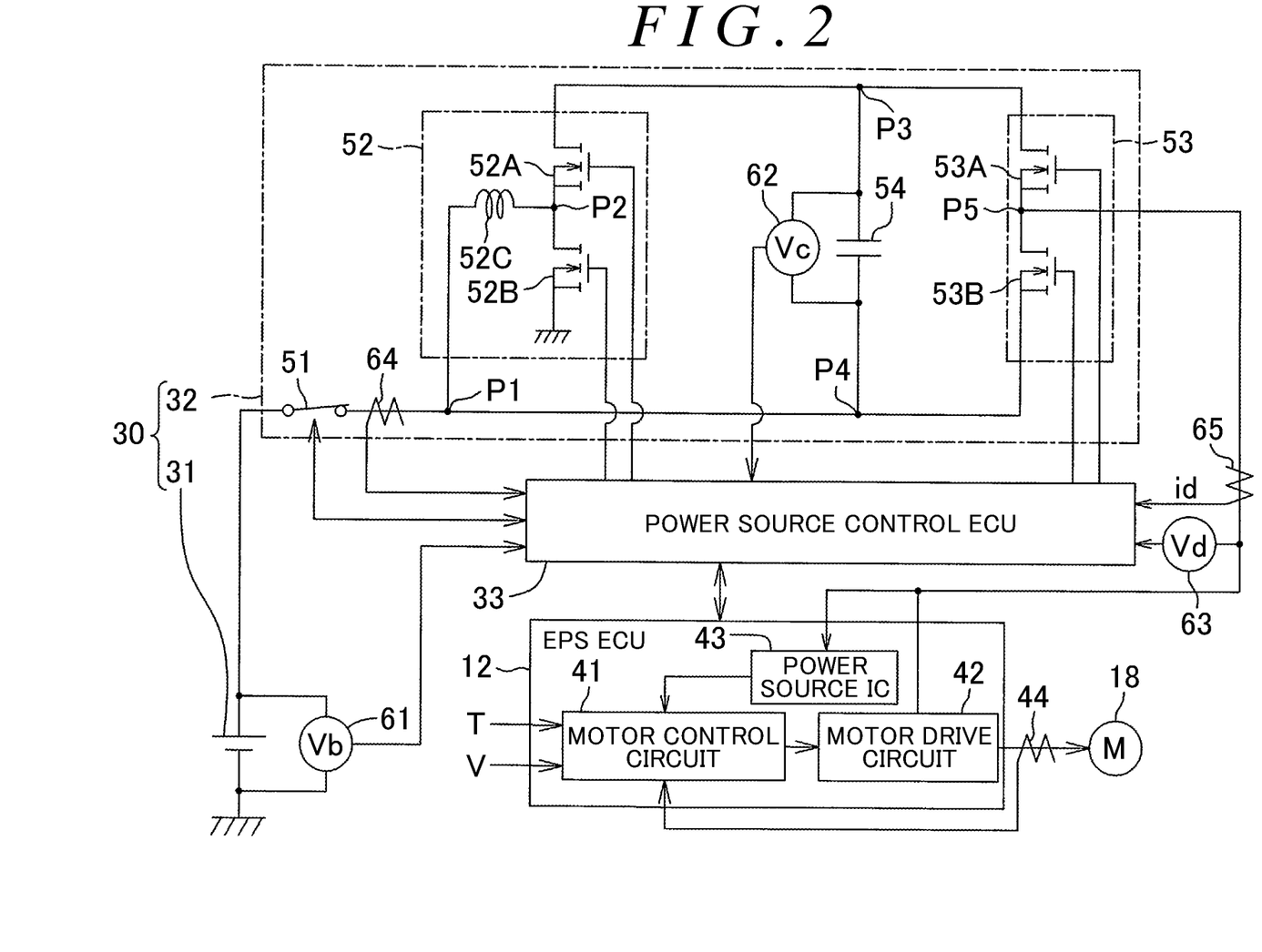
FIG. 2 is a circuit diagram illustrating the electrical configuration of the electric power steering system of FIG. 1.

The main power source 31 and the auxiliary power source device 32 constitute a power source device 30. The power source control ECU 33 is an example of a control device that controls the power source device 30. FIG. 2 is a circuit diagram illustrating the electrical configuration of the electric power steering system 1. The EPS ECU 12 includes a motor control circuit 41, the motor drive circuit (inverter circuit) 42, and the power source IC 43. The motor control circuit 41 is composed of a microcomputer. The motor drive circuit 42 is controlled by the motor control circuit 41, and supplies power to the electric motor 18. The power source IC 43 generates power for the motor control circuit 41. The EPS ECU 12 receives an output signal from a current sensor 44 configured to detect a motor current that flows through the electric motor 18.

The motor control circuit 41 controls drive of the motor drive circuit 42 on the basis of the steering torque T, the vehicle speed V, and the motor current. The steering torque T is detected by the torque sensor 11. The vehicle speed V is detected by the vehicle speed sensor 24. The motor current is detected by the current sensor 44. Specifically, the motor control circuit 41 sets a target current value on the basis of the steering torque T and the vehicle speed V, and controls drive of the motor drive circuit 42 such that the motor current which flows through the electric motor 18 is equal to the target current value.

The auxiliary power source device 32 is connected in series with the main power source 31. The auxiliary power source device 32 includes a relay 51, a charge circuit 52, a discharge circuit 53, and a capacitor 54 that serves as an auxiliary power source. The relay 51 is disposed between the positive terminal of the main power source 31 and the charge circuit 52. A point of connection between the relay 51 and the charge circuit 52 is denoted by P1. The charge circuit 52 is a circuit configured to charge the capacitor 54. The charge circuit 52 includes a pair of switching elements 52A and 52B connected in series with each other, and a voltage boosting coil 52C connected between a point of connection P2 between the switching elements 52A and 52B and the point of connection P1. The switching elements 52A and 52B are n-channel Metal-Oxide Semiconductor Field-Effect Transistors (MOSFETs).

The source of the upper switching element 52A is connected to the drain of the lower switching element 52B. The source of the lower switching element 52B is grounded. The drain of the upper switching element 52A is connected to the positive terminal of the capacitor 54. A point of connection between the upper switching element 52A and the positive terminal of the capacitor 54 is denoted by P3. The point of connection P1 is connected to the negative terminal of the capacitor 54. A point of connection between the point of connection P1 and the negative terminal of the capacitor 54 is denoted by P4.

The discharge circuit 53 is connected between the point of connection P3 and the point of connection P4. The discharge circuit 53 is composed of a pair of switching elements 53A and 53B connected in series with each other. The switching elements 53A and 53B are n-channel MOSFETs. The source of the upper switching element 53A is connected to the drain of the lower switching element 53B. The drain of the upper switching element 53A is connected to the point of connection P3. The source of the lower switching element 53B is connected to the point of connection P4. A point of connection P5 between the pair of switching elements 53A and 53B is connected to the motor drive circuit 42 and the power source IC 43 in the EPS ECU 12.

A terminal voltage (battery voltage Vb) of the main power source 31 is detected by a first voltage sensor 61. A terminal voltage (capacitor voltage Vc) of the capacitor 54 is detected by a second voltage sensor 62. A voltage (output voltage Vd) supplied from the power source device 30 (discharge circuit 53) to the EPS ECU 12 is detected by a third voltage sensor 63. An output current (battery current ib) from the main power source 31 is detected by a first current sensor 64. A current (output current id from the power source device 30) that flows from the power source device 30 (discharge circuit 53) to the EPS ECU 12 is detected by a second current sensor 65. The second current sensor 65 detects the direction and the magnitude of the current. In the embodiment, the direction of the current which is directed from the discharge circuit 53 toward the EPS ECU 12 is determined as positive, and the direction of the current which is directed from the EPS ECU 12 toward the discharge circuit 53 is determined as negative.

The detection values from the voltage sensors 61 to 63 and the detection values from the current sensors 64 and 65 are input to the power source control ECU 33. An ignition state detection signal (not illustrated) that indicates the state of an ignition key is input to the power source control ECU 33. The power source control ECU 33 controls on and off the relay 51 on the basis of the ignition state detection signal. When the ignition key is operated to be turned on, an ignition state detection signal that indicates that the ignition key has been turned on (hereinafter referred to as an "ignition on state signal") is input to the power source control ECU 33. The power source control ECU 33 turns on the relay 51 when the ignition on state signal is input. When the ignition key is operated to be turned off, on the other hand, an ignition state detection signal that indicates that the ignition key has been turned off (hereinafter referred to as an "ignition off state signal") is input to the power source control ECU 33. The power source control ECU 33 turns off the relay 51 when the ignition off state signal is input.

The power source control ECU 33 controls on and off the four switching elements 52A, 52B, 53A, and 53B in the auxiliary power source device 32 on the basis of the detection values from the voltage sensors 61 to 63, the current sensors 64 and 65, and so forth. The power source control ECU 33 controls the four switching elements 52A, 52B, 53A, and 53B on the basis of power consumption PS by the motor drive circuit 42. The power consumption PS is calculated by computing the product of the output voltage Vd which is detected by the third voltage sensor 63 and the output current id which is detected by the second current sensor 65, for example. The power consumption PS is an example of the "value that matches power consumption by the drive circuit".

Specifically, when an absolute value |PS| of the power consumption PS is less than an output voltage switching threshold KE determined in advance, the power source control ECU 33 turns off the upper switching element 53A in the discharge circuit 53, and turns on the lower switching element 53B, for example. Consequently, power is supplied to the motor drive circuit 42 by only the main power source 31. A power supply mode (power supply state) in which power is supplied to the EPS ECU 12 by only the main power source 31 in this way is occasionally referred to as a "normal output voltage mode (normal output voltage state)".

When the absolute value |PS| of the power consumption PS is less than the output voltage switching threshold KE, in addition, the power source control ECU 33 alternately turns on the pair of switching elements 52A and 52B in the charge circuit 52 as necessary. Consequently, the output voltage (battery voltage) at the point of connection P1 is raised and applied to the capacitor 54. Consequently, the capacitor 54 is charged.

When the absolute value |PS| of the power consumption PS is not less than the output voltage switching threshold KE, the power source control ECU 33 turns off the pair of switching elements 52A and 52B in the charge circuit 52. In addition, the power source control ECU 33 turns on the upper switching element 53A in the discharge circuit 53, and turns off the lower switching element 53B. Consequently, power is supplied to the motor drive circuit 42 by both the main power source 31 and the capacitor 54. In this case, a voltage obtained by adding the voltage of the capacitor 54 to the voltage of the main power source 31 is applied to the drive circuit 42. A power supply mode (power supply state) in which power is supplied to the EPS ECU 12 utilizing both the main power source 31 and the capacitor 54 in this way is occasionally referred to as a "high-output voltage mode (high-output voltage state)".

Figure 3:
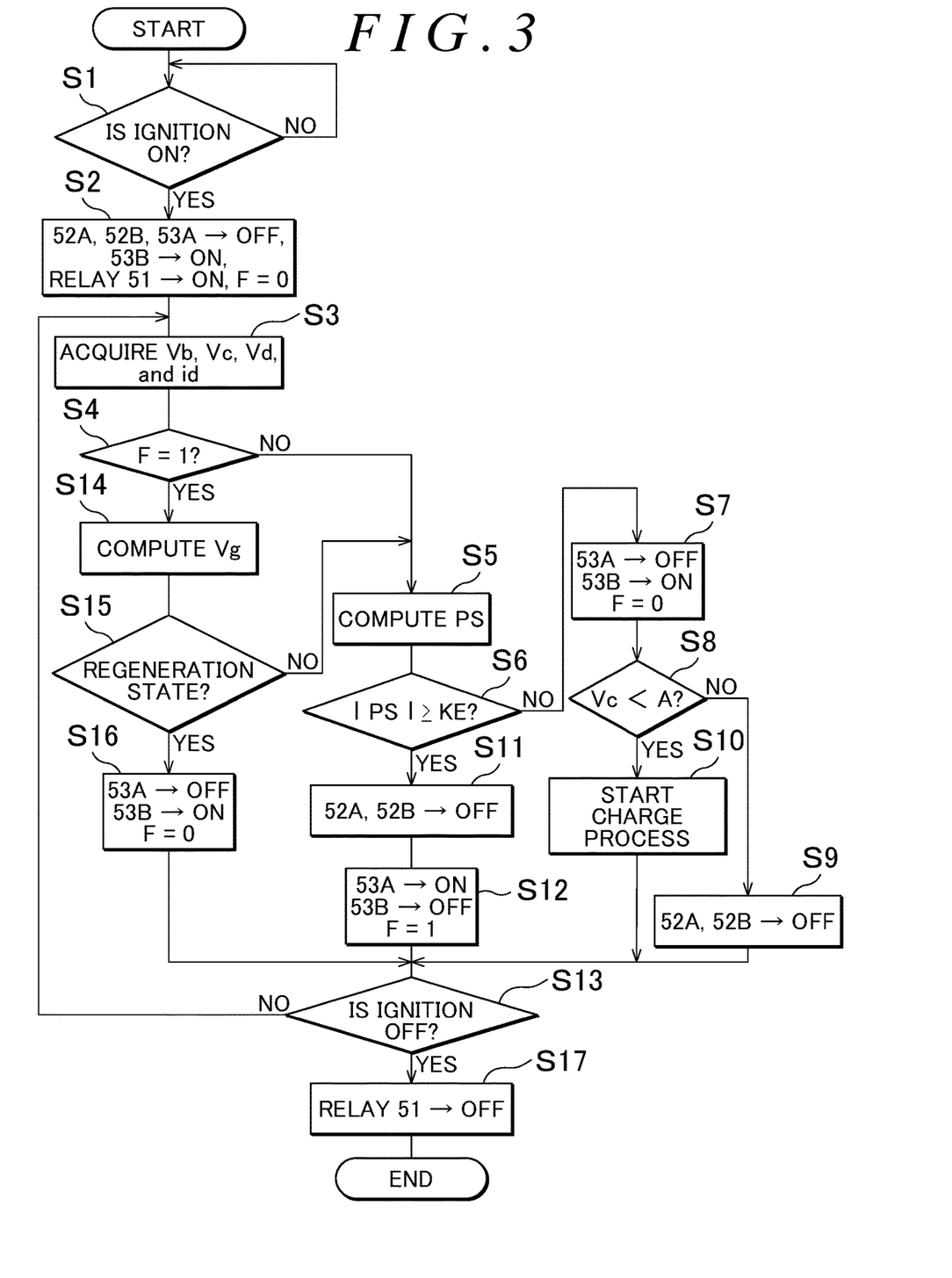
FIG. 3 is a flowchart illustrating operation of a power source control ECU.

In the embodiment, the power source control ECU 33 limits power to be supplied to the EPS ECU 12 when the operation state of the electric motor 18 is brought into a regeneration state when the power supply mode is the high-output voltage mode. FIG. 3 is a flowchart illustrating operation of the power source control ECU 33. When an ignition on state signal is input (step S1: YES), the power source control ECU 33 performs initial setting (step S2). In the initial setting, the power source control ECU 33 turns off the switching elements 52A, 52B, and 53A, turns on the switching element 53B, turns on the relay 51, and resets a mode flag F (F=0).

The mode flag F is a flag for storing whether the power supply mode is the normal output voltage mode or the high-output voltage mode. In the case where the power supply mode is the normal output voltage mode, the mode flag F is reset (F=0). In the case where the power supply mode is the high-output voltage mode, the mode flag F is set (F=1). In the initial setting, the power supply mode is set to the normal output voltage mode, and therefore the mode flag F is reset.

Next, the power source control ECU 33 acquires the battery voltage Vb, the capacitor voltage Vc, the output voltage Vd, and the output current id (step S3). The battery voltage Vb is detected by the first voltage sensor 61. The capacitor voltage Vc is detected by the second voltage sensor 62. The output voltage Vd is detected by the third voltage sensor 63. The output current id is detected by the second current sensor 65. Next, the power source control ECU 33 determines whether or not the mode flag F is set (F=1) (step S4). In the case where the mode flag F is reset (step S4: NO), that is, in the case where the power supply mode is the normal output voltage mode, the power source control ECU 33 transitions to step S5.

In step S5, the power source control ECU 33 computes the power consumption PS by multiplying the output voltage Vd and the output current id which are acquired in step S3. Then, the power source control ECU 33 determines whether or not the absolute value |PS| of the power consumption PS is equal to or more than the output voltage switching threshold KE (step S6). In the case where the absolute value |PS| of the power consumption PS is not equal to or more than the output voltage switching threshold KE (step S6: NO), the power source control ECU 33 turns off the upper switching element 53A in the discharge circuit 53, turns on the lower switching element 53B, and resets the mode flag F (F=0) (step S7). Consequently, discharge of the capacitor 54 is stopped in the case where such discharge is executed. Consequently, in addition, the power supply mode is brought into the normal output voltage mode.

After that, the power source control ECU 33 determines whether or not the capacitor voltage Vc is less than a predetermined charge determination threshold A (A>0) (step S8). This determination is made in order to prevent the capacitor 54 from being overcharged. The charge determination threshold A is set to a value that is equal to or slightly smaller than the upper limit voltage of the capacitor. In the case where the capacitor voltage Vc is not less than the charge determination threshold A (step S8: NO), the power source control ECU 33 turns off both the two switching elements 52A and 52B in the charge circuit 52 (step S9). Then, the power source control ECU 33 determines whether or not an ignition off state signal is input (step S13). If an ignition off state signal is not input (step S13: NO), the power source control ECU 33 returns to step S3.

In the case where it is determined in step S8 that the capacitor voltage Vc is less than the charge determination threshold A (step S8: YES), the power source control ECU 33 starts a charge process for the capacitor 54 (step S10). Specifically, the power source control ECU 33 alternately turns on the pair of switching elements 52A and 52B in the charge circuit 52. Consequently, the capacitor 54 is charged. In the case where a charge process has already been started when a transition is made from step S8 to step S10, the power source control ECU 33 continuously performs the charge process.

After that, the power source control ECU 33 transitions to step S13, and determines whether or not an ignition off state signal is input. If an ignition off state signal is not input (step S13: NO), the power source control ECU 33 returns to step S3. In the case where it is determined in step S6 that the absolute value |PS| of the power consumption PS is equal to or more than the output voltage switching threshold KE (step S6: YES), the power source control ECU 33 turns off both the two switching elements 52A and 52B in the charge circuit 52 (step S11). Consequently, the charge process is stopped in the case where the charge process is being executed.

Next, the power source control ECU 33 turns on the upper switching element 53A in the discharge circuit 53, turns off the lower switching element 53B, and sets the mode flag F (F=1) (step S12). Consequently, the power supply mode is brought into the high-output voltage mode.

After that, the power source control ECU 33 transitions to step S13, and determines whether or not an ignition off state signal is input. If an ignition off state signal is not input (step S13: NO), the power source control ECU 33 returns to step S3.

In the case where the mode flag F is set (step S4: YES), that is, in the case where the power supply mode is the high-output voltage mode, in step S4, the power source control ECU 33 transitions to step S14. In step S14, the power source control ECU 33 computes a counter-electromotive voltage Vg on the basis of the following formula (1):

$$Vg=Vd-(Vb+Vc) \quad (1)$$

Vd, Vb, and Vc are the output voltage, the battery voltage, and the capacitor voltage, respectively, which are acquired in step S3.

Next, the power source control ECU 33 determines whether or not the operation state of the electric motor 18 is the regeneration state (step S15). Specifically, the power source control ECU 33 determines whether or not the sign of the output current id which is acquired in step S3 is negative and the counter-electromotive voltage Vg which is computed in step S14 is more than a predetermined threshold B (B>0). In the case where such conditions are met, the power source control ECU 33 determines that the operation state of the electric motor 18 is the regeneration state. In the case where such conditions are not met, the power source control ECU 33 determines that the operation state of the electric motor 18 is a power-running state.

In the case where it is determined that the operation state of the electric motor 18 is the power-running state (step S15: NO), the power source control ECU 33 transitions to step S5. In this case, the processes in and after step S5 discussed earlier are executed. In the case where it is determined in step S15 that the operation state of the electric motor 18 is the regeneration state, on the other hand, the power source control ECU 33 turns off the upper switching element 53A in the discharge circuit 53, turns on the lower switching element 53B, and resets the mode flag F (F=0) (step S16). Consequently, discharge of the capacitor 54 is stopped in the case where such discharge is executed. Consequently, the power supply mode is brought into the normal output voltage mode.

After that, the power source control ECU 33 transitions to step S13, and determines whether or not an ignition off state signal is input. If an ignition off state signal is not input (step S13: NO), the power source control ECU 33 returns to step S3. In the case where it is determined in step S13 that an ignition off state signal is input (step S13: YES), the power source control ECU 33 turns off the relay 51 (step S17). Then, the power source control ECU 33 ends the current processing.

In the embodiment, the power supply mode is switched to the normal output voltage mode when the operation state of the electric motor 18 is brought into the regeneration state in the case where the power supply mode is the high-output voltage mode (see steps S15 and S16). Consequently, the output voltage from the power source device 30 can be prevented from becoming excessive when the operation state of the electric motor 18 is brought into the regeneration state, and thus occurrence of a failure in the EPS ECU 12 can be suppressed.

In the embodiment discussed earlier, when the power supply mode is the high-output voltage mode, the power source control ECU 33 turns on the upper switching element 53A in the discharge circuit 53, and turns off the lower switching element 53B. When the power supply mode is the high-output voltage mode, however, the power source control ECU 33 may alternately turn on the pair of switching elements 53A and 53B in the discharge circuit 53 through pulse width modulation (PWM) control based on the power consumption PS by the motor drive circuit 42. An embodiment for such a case (hereinafter referred to as a "modification") will be described.

A method of controlling the switching elements 53A and 53B when the power supply mode is the high-output voltage mode will be described more specifically. The ratio of an on period of the switching element 53A in the PWM cycle is defined as a duty ratio D1 [%]. The ratio of an on period of the switching element 53B in the PWM cycle is defined as a duty ratio D2 [%]. In the PWM cycle, the switching element 53B is turned on in the period in which the switching element 53A is turned off. Thus, D2 is defined as D2=(100−D1). It should be noted, however, that a dead time is set between the on period of the switching element 53A and the on period of the switching element 53B. As D1 becomes higher, the output voltage from the power source device 30 becomes higher.

In the case where the absolute value |PS| of the power consumption PS is equal to or more than the output voltage switching threshold KE, the power source control ECU 33 computes the duty ratio D1 in accordance with a deviation |PS−KE| between the absolute value |PS| of the power consumption PS and the output voltage switching threshold KE such that the duty ratio D1 becomes higher as the deviation |PS−KE| becomes larger. Then, if the computed duty ratio D1 is equal to or less than a limit value L, the power source control ECU 33 performs PWM control on the switching elements 53A and 53B using the computed duty ratio D1 as the final duty ratio D1. In the case where the computed duty ratio D1 is more than the limit value L, on the other hand, the power source control ECU 33 performs PWM control on the switching elements 53A and 53B using the limit value L as the final duty ratio D1.

In the modification, a first limit value L1 which is a normal limit value is used as the limit value L during normal times, and a second limit value L2 for overvoltage prevention is used as the limit value L when the electric motor 18 is brought into the regeneration state in the case where the power supply mode is the high-output voltage mode. In the modification, the first limit value L1 is set to 100 which is the maximum value of the duty ratio D1. A method of computing the second limit value L2 will be discussed later.

Figure 4A:
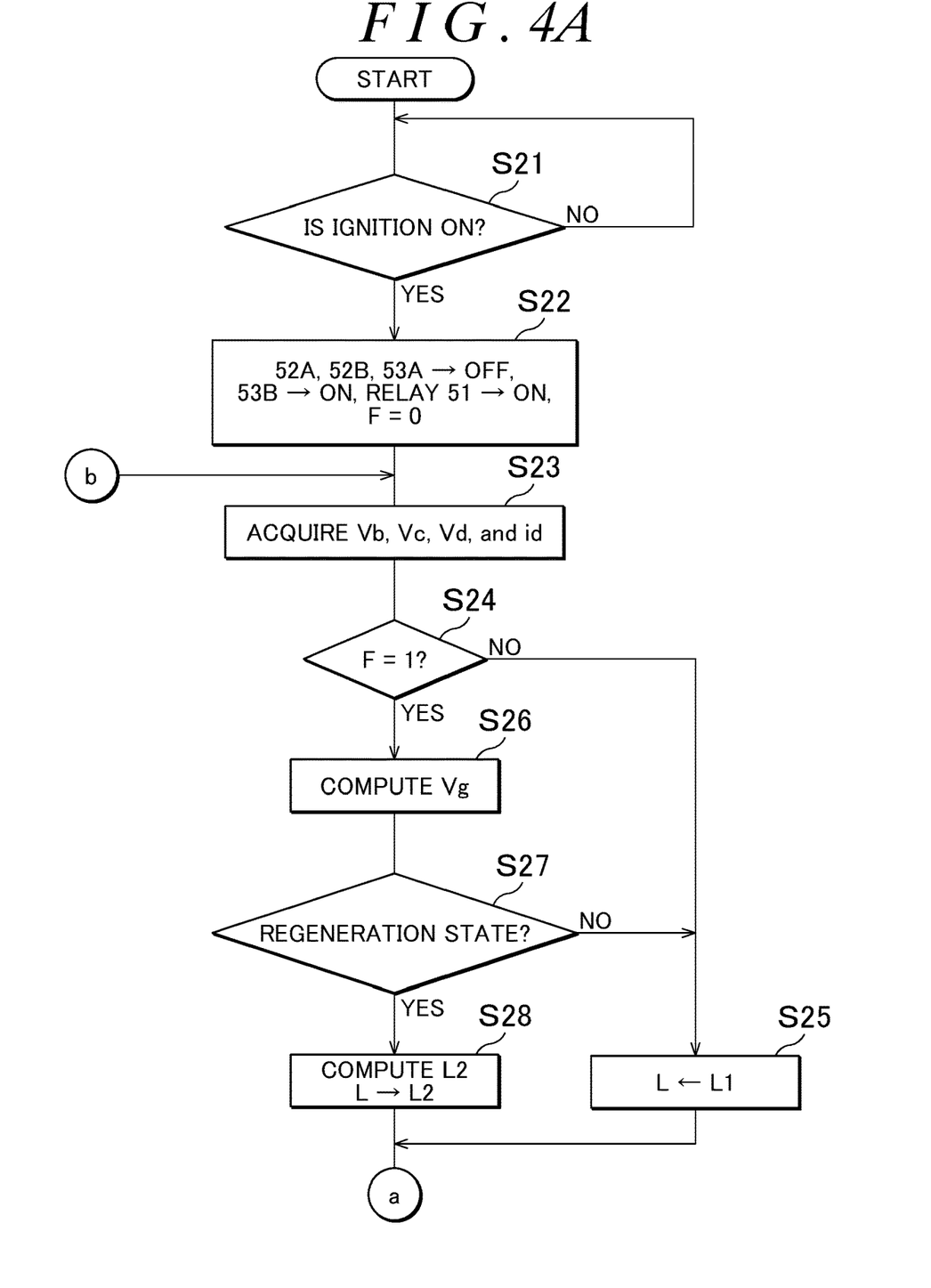
FIG. 4A is a part of a flowchart illustrating a modification of operation of the power source control ECU.
Figure 4B:
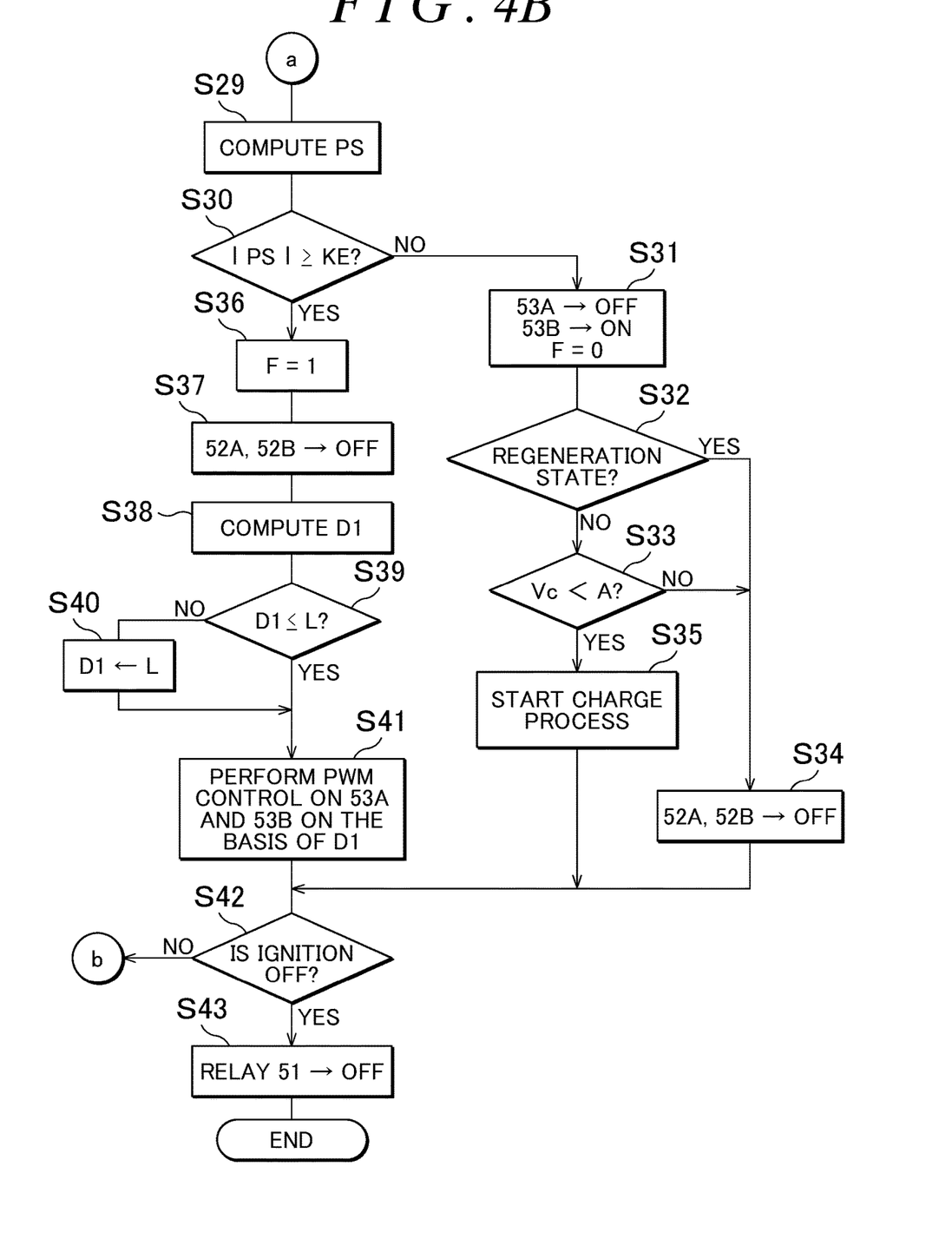
FIG. 4B is a part of the flowchart illustrating the modification of operation of the power source control ECU.

FIGS. 4A and 4B are flowcharts illustrating the power source control ECU 33 according to the modification. When an ignition on state signal is input (step S21: YES), the power source control ECU 33 performs initial setting (step S22). In the initial setting, the power source control ECU 33 turns off the switching elements 52A, 52B, and 53A, turns on the switching element 53B, turns on the relay 51, and resets a mode flag F (F=0).

Next, the power source control ECU 33 acquires the battery voltage Vb, the capacitor voltage Vc, the output voltage Vd, and the output current id (step S23). The battery voltage Vb is detected by the first voltage sensor 61. The capacitor voltage Vc is detected by the second voltage sensor 62. The output voltage Vd is detected by the third voltage sensor 63. The output current id is detected by the second current sensor 65. Next, the power source control ECU 33 determines whether or not the mode flag F is set (step S24). In the case where the mode flag F is reset (F=0) (step S24: NO), that is, in the case where the power supply mode is the normal output voltage mode, the power source control ECU 33 transitions to step S25.

In step S25, the power source control ECU 33 sets the limit value L for the duty ratio D1 for the switching element 53A during the high-output voltage mode to the first limit value L1 which is a normal limit value. Then, the power source control ECU 33 transitions to step S29. In the case where the mode flag F is set (F=1) (step S24: YES), that is, in the case where the power supply mode is the high-output voltage mode, in step S24, the power source control ECU 33 transitions to step S26.

In step S26, the power source control ECU 33 computes a counter-electromotive voltage Vg on the basis of the following formula (2):

$$Vg = Vd - \{Vb + (Vc \cdot D1/100)\} \quad (2)$$

Vd, Vb, and Vc are the output voltage, the battery voltage, and the capacitor voltage, respectively, which are acquired in step S23. D1 is the duty ratio which is currently set for the switching element 53A.

Next, the power source control ECU 33 determines whether or not the operation state of the electric motor 18 is the regeneration state (step S27). Specifically, the power source control ECU 33 determines whether or not the sign of the output current id which is acquired in step S23 is negative and the counter-electromotive voltage Vg which is computed in step S26 is more than a predetermined threshold B (B>0). In the case where such conditions are met, the power source control ECU 33 determines that the operation state of the electric motor 18 is the regeneration state. In the case where such conditions are not met, the power source control ECU 33 determines that the operation state of the electric motor 18 is a power-running state.

In the case where it is determined that the operation state of the electric motor 18 is the power-running state (step S27: NO), the power source control ECU 33 transitions to step S25. In this case, the limit value L of the duty ratio D1 is set to the first limit value L1. In the case where it is determined in step S27 that the operation state of the electric motor 18 is the regeneration state (step S27: YES), on the other hand, the power source control ECU 33 computes the second limit value L2, and sets the second limit value L2 as the limit value L of the duty ratio D1 (step S28).

A method of computing the second limit value L2 will be described. A voltage at which the output voltage from the power source device 30 (discharge circuit 53) becomes an overvoltage in the case where a counter-electromotive force is generated is defined as Vth, it is necessary to limit the output voltage from the power source device 30 to Vth or less. Thus, it is necessary that the second limit value L2 for the duty ratio D1 should meet the following formula (3):

$$Vb + (Vc \cdot L2/100) + Vg \leq Vth \quad (3)$$

Vb and Vc are the power source voltage and the capacitor voltage, respectively, which are acquired in step S23. Vg is the counter-electromotive force which is computed in step S26.

From the formula (3), the second limit value L2 is indicated by the following formula (4):

$$L2 \leq \{(Vth - Vb - Vg)/Vc\} \times 100 \quad (4)$$

After that, the power source control ECU 33 transitions to step S29. In step S29, the power source control ECU 33 computes the power consumption PS by multiplying the output voltage Vd and the output current id which are acquired in step S23. Then, the power source control ECU 33 determines whether or not the absolute value |PS| of the power consumption PS is equal to or more than the predetermined output voltage switching threshold KE (step S30).

In the case where the absolute value |PS| of the power consumption PS is not equal to or more than the output voltage switching threshold KE (step S30: NO), the power source control ECU 33 turns off the upper switching element 53A in the discharge circuit 53, turns on the lower switching element 53B, and resets the mode flag F (F=0) (step S31). Consequently, discharge of the capacitor 54 is stopped in the case where such discharge is executed. In addition, the power supply mode is brought into the normal output voltage mode.

After that, the power source control ECU 33 determines whether or not the operation state of the electric motor 18 is the regeneration state (step S32). The determination method is the same as that in step S27 discussed earlier. In the case where the operation state of the electric motor 18 is not the regeneration state (step S32: NO), the power source control ECU 33 determines whether or not the capacitor voltage Vc is less than a predetermined charge determination threshold A (A>0) (step S33). This determination is made in order to prevent the capacitor 54 from being overcharged. The charge determination threshold A is set to a value that is equal to or slightly smaller than the upper limit voltage of the capacitor.

In the case where it is determined in step S32 that the operation state of the electric motor 18 is the regeneration state (step S32: YES), or in the case where it is determined in step S33 that the capacitor voltage Vc is not less than the charge determination threshold A (step S33: NO), the power source control ECU 33 transitions to step S34. In step S34, the power source control ECU 33 turns off both the two switching elements 52A and 52B in the charge circuit 52. Then, the power source control ECU 33 determines whether or not an ignition off state signal is input (step S42). If an ignition off state signal is not input (step S42: NO), the power source control ECU 33 returns to step S23.

In the case where it is determined in step S33 that the capacitor voltage Vc is less than the charge determination threshold A (step S33: YES), the power source control ECU 33 starts a charge process for the capacitor 54 (step S35). Specifically, the power source control ECU 33 alternately turns on the pair of switching elements 52A and 52B in the charge circuit 52. Consequently, the capacitor 54 is charged. In the case where a charge process has already been started when a transition is made from step S33 to step S35, the power source control ECU 33 continuously performs the charge process.

After that, the power source control ECU 33 transitions to step S42, and determines whether or not an ignition off state signal is input. If an ignition off state signal is not input (step S42: NO), the power source control ECU 33 returns to step S23. In the case where it is determined in step S30 that the absolute value |PS| of the power consumption PS is equal to or more than the output voltage switching threshold KE (step S30: YES), the power source control ECU 33 sets the mode flag F (F=1) (step S36). In addition, the power source control ECU 33 turns off both the two switching elements 52A and 52B in the charge circuit 52 (step S37). Consequently, the charge process is stopped in the case where the charge process is being executed.

Next, the power source control ECU 33 computes the duty ratio D1 for the switching element 53A on the basis of the deviation |PS−KE| between the absolute value |PS| of the power consumption PS and the output voltage switching threshold KE (step S38). Then, the power source control ECU 33 determines whether or not the computed duty ratio D1 is equal to or less than the limit value L (step S39). The limit value L is the second limit value L2, which is computed in step S28, in the case where it is determined that the power supply mode is the high-output voltage mode and the operation state is the regeneration state, and the first limit value, which is set in step S25, otherwise.

If the computed duty ratio D1 is equal to or less than the limit value L (step S39: YES), the power source control ECU 33 directly transitions to step S41. In step S41, PWM control is performed on the switching elements 53A and 53B on the basis of the duty ratio D1. Consequently, the power supply mode is brought into the high-output voltage mode. Then, the power source control ECU 33 transitions to step S42.

In the case where it is determined in step S39 that the computed duty ratio D1 is not equal to or less than the limit value L (step S39: NO), on the other hand, the power source control ECU 33 sets the limit value L to the final duty ratio D1 for the switching element 53A (step S40), and thereafter transitions to step S41. Consequently, the duty ratio D1 for the switching element 53A is limited to the limit value L or less although the power supply mode is the high-output voltage mode. In the case where the power supply mode is the high-output voltage mode and the operation state is the regeneration state, the limit value L is set to the second limit value L2, and thus the output voltage for the power source device 30 can be prevented from becoming an overvoltage in the regeneration state.

After that, the power source control ECU 33 transitions to step S42. In step S42, the power source control ECU 33 determines whether or not an ignition off state signal is input. If an ignition off state signal is not input (step S42: NO), the power source control ECU 33 returns to step S23.

In the case where it is determined in step S42 that an ignition off state signal is input (step S42: YES), the power source control ECU 33 turns off the relay 51 (step S43). Then, the power source control ECU 33 ends the current processing.

In the embodiment, the duty ratio D1 for the switching element 53A is limited to the second limit value L2 (see steps S28 and S40) when the operation state of the electric motor 18 is brought into the regeneration state in the case where the power supply mode is the high-output voltage mode. Consequently, the output voltage from the power source device 30 can be prevented from becoming excessive when the operation state of the electric motor 18 is brought into the regeneration state, and thus occurrence of a failure in the EPS ECU 12 can be suppressed.

While an embodiment of the present invention has been described above, the present invention may be implemented in other embodiments. In the embodiment discussed earlier, switching is made between the normal output voltage mode and the high-output voltage mode on the basis of whether or not the absolute value |PS| of the power consumption PS by the EPS ECU 12 is equal to or more than the output voltage switching threshold KE. However, switching may be made between the normal output voltage mode and the high-output voltage mode on the basis of whether or not the main power source power is equal to or more than the output voltage switching threshold KE. The main power source power is the actual power of the main power source 31 consumed by the EPS ECU 12 through assist control. The main power source power is calculated by computing the product of the battery current ib which is detected by the first current sensor 64 and the battery voltage Vb which is detected by the first voltage sensor 61. The main power source power is an example of the "value that matches power consumption by the drive circuit".

In the embodiment discussed earlier, the auxiliary power source is constituted from one capacitor. However, the auxiliary power source may be constituted from a plurality of capacitors. Alternatively, the auxiliary power source may be constituted from one or a plurality of power source elements other than the capacitors. Examples of power source elements other than the capacitors include all-solid-state batteries, lithium-ion batteries, and so forth. In the embodiment discussed earlier, in addition, the power source system according to the present invention is applied to an electric power steering system. However, the present invention is also applicable to any device for a vehicle that uses an electric motor other than an electric power steering system.

Besides, a variety of design changes may be made without departing from the scope described in the claims.

What is claimed is:

1. A power source system for use in a vehicle that includes an electric motor, the power source system comprising:
a power source device; and
a control device that controls the power source device, the control device including an electronic control unit (ECU), wherein:
the power source device includes:
a main power source,
an auxiliary power source, and
a switching circuit configured to switch a power supply mode between (i) a first power supply mode, in which power is supplied to a drive circuit of the electric motor by only the main power source, and (ii) a second power supply mode, in which power is supplied to the drive circuit by both the main power source and the auxiliary power source; and the ECU of the control device includes:
- a switching circuit control unit that controls the switching circuit based on a value that matches power consumption by the drive circuit,
- a determination unit that determines whether an operation state of the electric motor is a regeneration state or a power-running state, and
- a limitation unit that limits power supplied to the drive circuit when the power supply mode is the second power supply mode and the determination unit determines that the operation state of the electric motor is in the regeneration state.

2. The power source system according to claim 1, wherein the limitation unit is configured to switch the power supply mode to the first power supply mode by controlling the switching circuit when the power supply mode is the second power supply mode and the determination unit determines that the operation state of the electric motor is the regeneration state.

3. The power source system according to claim 2, wherein:
the ECU of the control device includes a counter-electromotive force computation unit that computes a counter-electromotive force generated in the electric motor; and
the determination unit is configured to determine whether the operation state of the electric motor is the regeneration state or the power-running state based on (i) a direction of a current that flows from the power source device to the drive circuit and (ii) a magnitude of the counter-electromotive force computed by the counter-electromotive force computation unit.

4. The power source system according to claim 2, wherein the auxiliary power source is composed of a capacitor.

5. The power source system according to claim 1, wherein:
the switching circuit control unit is configured to alternately switch between (i) a first state, in which power is supplied to the drive circuit from a series circuit of the main power source and the auxiliary power source, and (ii) a second state, in which power is supplied to the drive circuit from only the main power source, through Pulse Width Modulation (PWM) control based on the value that matches the power consumption by the drive circuit when the power supply mode is the second power supply mode; and
the limitation unit is configured to limit a duty ratio of the first state in a Pulse Width Modulation (PWM) cycle when the power supply mode is the second power supply mode and the determination unit determines that the operation state of the electric motor is the regeneration state.

6. The power source system according to claim 5, wherein:
the ECU of the control device includes a counter-electromotive force computation unit that computes a counter-electromotive force generated in the electric motor; and
the limitation unit includes:
- a limit value computation unit that computes a limit value based on the counter-electromotive force computed by the counter-electromotive force computation unit, and
- a duty ratio unit configured to limit the duty ratio of the first state in the PWM cycle to the limit value computed by the limit value computation unit or less.

7. The power source system according to claim 5, wherein:
the ECU of the control device includes a counter-electromotive force computation unit that computes a counter-electromotive force generated in the electric motor; and
the determination unit is configured to determine whether the operation state of the electric motor is the regeneration state or the power-running state based on (i) a direction of a current that flows from the power source device to the drive circuit and (ii) a magnitude of the counter-electromotive force computed by the counter-electromotive force computation unit.

8. The power source system according to claim 5, wherein the auxiliary power source is composed of a capacitor.

9. The power source system according to claim 1, wherein:
the ECU of the control device includes a counter-electromotive force computation unit that computes a counter-electromotive force generated in the electric motor; and
the determination unit is configured to determine whether the operation state of the electric motor is the regeneration state or the power-running state based on (i) a direction of a current that flows from the power source device to the drive circuit and (ii) a magnitude of the counter-electromotive force computed by the counter-electromotive force computation unit.

10. The power source system according to claim 1, wherein the auxiliary power source is composed of a capacitor.

* * * * *